United States Patent [19]

Chin et al.

[11] Patent Number: 4,647,123
[45] Date of Patent: Mar. 3, 1987

[54] BUS NETWORKS FOR DIGITAL DATA PROCESSING SYSTEMS AND MODULES USABLE THEREWITH

[75] Inventors: Daniel Y. S. Chin; David D. Miller; William L. May; Dennis G. Baker, all of Austin, Tex.

[73] Assignee: Gulf & Western Manufacturing Company, Southfield, Mich.

[21] Appl. No.: 464,342

[22] Filed: Feb. 7, 1983

[51] Int. Cl.$^4$ .......................... H01R 9/09; H05K 1/11
[52] U.S. Cl. ................................. 339/17 LM; 361/413
[58] Field of Search .......... 339/17 LC, 17 L, 17 LM, 339/17 M; 361/407, 412, 413, 415

[56] References Cited

U.S. PATENT DOCUMENTS

| | | | |
|---|---|---|---|
| 3,368,117 | 2/1968 | Pond et al. | 361/407 |
| 3,675,083 | 7/1972 | White | 339/17 LM |
| 3,699,396 | 10/1972 | Colaud et al. | 339/17 |
| 3,710,324 | 1/1973 | Cohen et al. | 340/172.5 |
| 3,815,099 | 6/1974 | Cohen et al. | 340/172.5 |
| 3,867,000 | 2/1975 | Michalak et al. | 339/17 L |
| 3,993,935 | 11/1976 | Phillips et al. | 339/17 L |
| 4,016,369 | 4/1977 | Pedersed | 340/147 R |
| 4,050,098 | 9/1977 | Seipp | 364/900 |
| 4,253,087 | 2/1981 | Saal | 340/147 R |
| 4,420,793 | 12/1983 | Strandberg | 361/415 |

FOREIGN PATENT DOCUMENTS 0015054 9/1980 European Pat. Off. .
0017412 10/1980 European Pat. Off. .

*Primary Examiner*—Neil Abrams
*Attorney, Agent, or Firm*—Body, Vickers & Daniels

[57] ABSTRACT

A structure for interconnecting a plurality of modules into a data processing system, which structure includes a plurality of module receiving receptacles, several process active, individual first electrical conductors intersecting the receptacles wherein the conductors are positionally located in sequence, i.e. 1, 2, 3 . . . n, and including means on a selected type of module for interconnecting these several conductors in comformity with the position sequence, whereby the conductors may be interconnected in the data processing system through the receptacle in the positional sequence. Consequently, insertion of a preselected module into a given module receptacle controls the continuity of the bus network to an adjacent receptacle.

3 Claims, 22 Drawing Figures (LOCAL PROCESSOR)

SYSTEM
(PROCESSOR WITH
OPTIONAL I/O
CONNECTOR)
(SYSTEM MEMORY)
(PERIPHERAL)

L BUS CONNECTOR WITH I/O

L BUS CONNECTOR WITHOUT I/O (PROCESSOR MEMORY)

(MULT-PURPOSE PROCESSOR CARD)

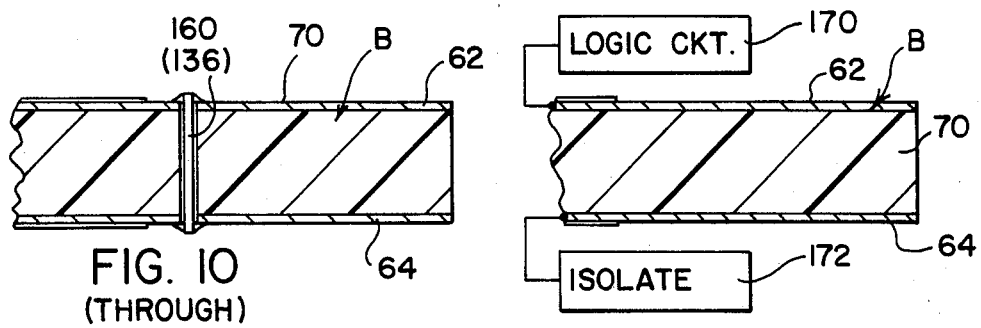
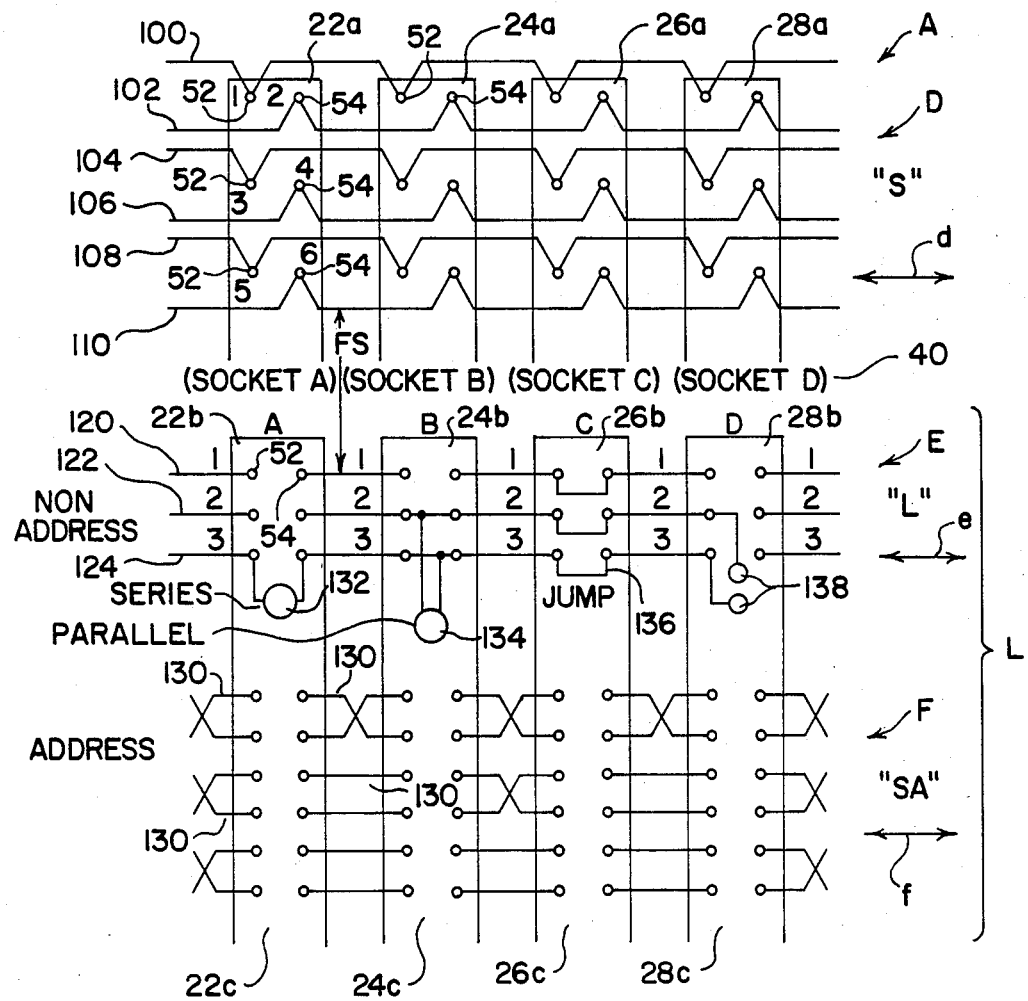

(SLOT LOCATION)

(LOCAL I)

(LOCAL II)

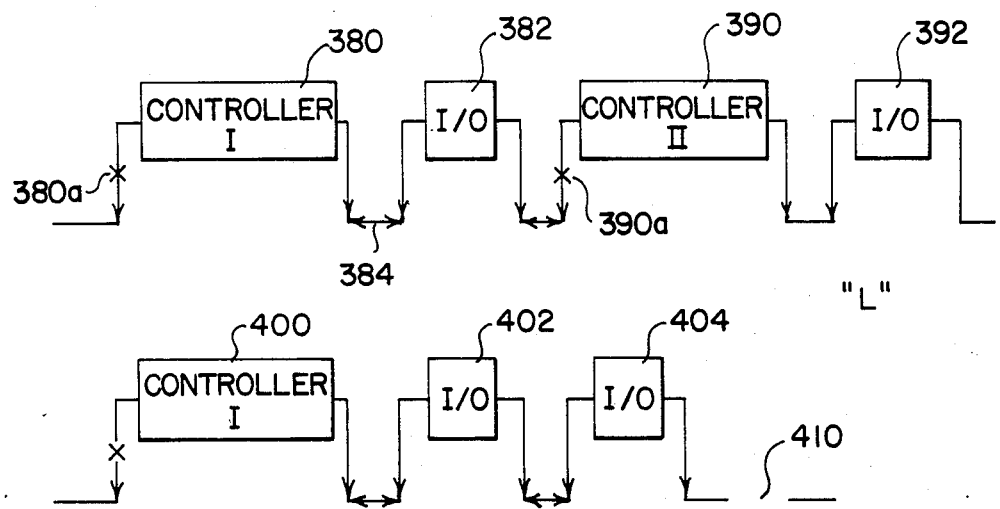

BUS NETWORKS FOR DIGITAL DATA PROCESSING SYSTEMS AND MODULES USABLE THEREWITH

The present invention relates to a structure for supporting modules in a digital control system and modules therefor and, more particularly, to such a system and modules wherein the modules can control the motherboard or bus network employed by the system.

BACKGROUND OF THE INVENTION

With the advent of the microprocessor, a tremendous control industry has developed wherein the microprocessor is employed as a central process unit for a digital data processing system. Such digital systems generally employ a frame or rack for supporting a plurality of generally parallel, card like modules, each of which contains its own digital circuits and components. These cards or modules are generally printed circuit boards with a number of attached components, many of which are IC chips. An array of terminals adjacent an edge of the module is used to interconnect the module with conductors in the rack or frame.

The total digital system, including processor, memories, I/O connections and peripheral accessories, is joined together in an architecture generally determined by the supporting frame. To facilitate interchangeability and maintenance, the frame or rack often includes a motherboard arrangement wherein the bus network itself is permanently located in the supporting frame. By inserting the cards into receptacles on the racks, the terminal arrays on the edge of the cards coact with motherboard terminals to connect the individual modules or cards into the control system. Although this assembly concept is simple, complexity is created by the large number of component and system manufacturers. The scheme by which different suppliers use the permanent bus network is often different. There are many ways to interconnect the separate cards or modules and to apply digital data to the individual conductors in the motherboard of the frame to control the processing of digital data. Consequently, interconnection of the various cards with the processor on one of the cards and communication between the system itself and external equipment demand that the architecture be matched. To provide some uniformity, manufacturers of the processors themselves have developed certain bus arrangements wherein the bus networks include a large number of individual conductors, each of which is assigned a particular function generally associated with the scheme selected by the manufacturer. These bus networks provide a certain uniformity from one system to another as long as the scheme determined by the processor manufacturer is followed. Such attempts to provide uniformity in the industry have not been successful. One major difficulty is that the use of preassigned conductors in a network places drastic constraints on the support frame used in supporting the several cards or modules, the number of receptacles within that frame determine the extent to which the system can be expanded. This provides hesitation on the part of the consuming public in that a major investment may be outdated in a short period of time or, as an alternative, the customer can not maintain state of art technology for its particular control system. This difficulty comes even more pronounced when a customer decides to install additional digital processing systems. Each system must employ its own frame even though it is possible that prior systems used at the same site have capacity which is not employed. Thus, the industry is constrained by lack of standardization and, more importantly, by the inability of existing bus networks to allow flexibility in the number of cards and the number of individual systems mountable in a given frame structure.

THE INVENTION

The present invention relates to a structure for supporting individual cards or modules of a digital processing system which overcomes the disadvantages discussed above and which also allows the use of standard cards having a predetermined shaped profile which is indicative of the function to which the card is employed in the digital control system.

A primary object of the present invention is the provision of a structure to support a plurality of card-like modules, which structure can include more than one digital control system using the same bus network without time sharing.

Another object of the present invention is the provision of a structure as defined above, wherein insertion of a card into a receptacle in the structure determines the interconnection between adjacent receptacles. The use of the cards can determine the extent to which various receptacles are employed in one or more independent digital processing systems.

Yet another object of the present invention is the provision of a structure, as defined above, which structure uses two separate bus networks each of which is positionally spaced with respect to each other and intersect the card receiving receptacle, whereby one of the bus networks does not have electrical connections through the individual receptacles. In this manner, insertion of a particular card-like module into a receptacle of the structure can determine the architecture and structural confinement of one or more digital control systems.

Yet another object of the present invention is the provision of a structure having two separate bus networks, as defined above, which system can use one bus network to interconnect between modules or cards mounted in various locations on the frame. In this manner, one set network can be used for controlling and interconnecting of a plurality of cards or modules in one system in a manner separate from the other on the same bus network. The second bus network can be used, if necessary, to provide overall system control or crosstalk. To use the second bus network, a particular module can include terminal arrangements for providing interconnection between the two separate bus networks at a given card receptacle.

A further object of the present invention is the provision of a structure, as defined above, which structure allows the creation of separate and distinct control systems in the same frame or rack, without cross-talk.

Still a further object of the present invention is the provision of a structure, as defined above, which structure allows the use of a standard module shape wherein the profile is selected to determine the specific function of the module or card in the overall control scheme when it is inserted into the supporting structure.

These and other objects and advantages will become apparent from the following description of the invention.

THE INVENTION

In accordance with the present invention there is provided a structure for supporting generally flat, modules of the type containing electrical circuits for digital processing of data and having a bus network connecting edge. This structure includes a number of separate module receiving receptacles, each capable of receiving and retaining one of the modules, with the edge of the module intersecting first and second spaced, generally parallel, areas of the module supporting structure. The first and second generally parallel areas extend in a preselected direction. A first bus network is located along the first area of the supporting structure and contains several process active, individual first electrical conductors. These first electrical conductors in the first bus network are electrically connectable to the terminal array on the edge of a module by providing means on the structure, frame or rack. The first electrical conductors do not extend across the module receptacles. A module inserted into a receiving means or receptacle includes a preselected interconnecting feature to determine whether or not the bus network continues through the receptacle to the next module receptacle. In this manner, a given module can be employed in a receptacle to terminate the first bus network. This can isolate sections of the first bus network to provide a barrier for a data processing system. The term "process active" indicates that the conductors of this first network are the type conductors used for designated purposes in the general interconnection of modules to construct a digital control system. In other words, several conductors are used, some of which are designated as address lines, data lines, interrupt lines, busy lines, read/write lines, etc.

In accordance with another aspect of the present invention there is provided a second bus network at a second area of the module supporting structure and containing several individual second electrical conductors extending generally parallel to the preselected direction and being continuous through the receptacles. In this manner, the second bus network is not selectively isolated by insertion of a particular type of card or module. This second network can be used for interconnecting separate and distinct control systems. In addition, this second bus network can be connected to a master control system which controls the overall function of the individual systems determined by the interconnection of the various conductors of the first bus network. In this manner, the first bus network provides interconnecting wires between the receptacles. The insertion of a selected type of module into a receptacle connects the bus conductors across the receptacle. The opposite is true of the second bus network which is spatially fixed with respect to the first bus network but has its conductors extending through the receptacles. By employing these two separate bus networks, the shape of the module can determine whether or not a module placed into a particular slot or receptacle can interconnect one bus network with the other. Also, the particular module or card inserted into a given receptacle can interconnect and continue the flow of and continuity between the conductors on opposite sides of the receptacle to determine whether or not a particular receptacle is to be used as a terminating and/or starting area for an isolated digital control system mounted on the structure.

In accordance with another aspect of the invention, there is provided a structure for interconnecting a plurality of modules into a data processing system, this structure includes a plurality of module receiving receptacles, several process active, individual first electrical conductors interconnecting the receptacle wherein the conductors are positionally located in sequence, i.e. 1, 2, 3 ... n, and including means on a selected type module for interconnecting the several conductors across a receptacle in conformity with the sequence mentioned above, whereby the bus conductors can be selectively interconnected in the system through the receptacle by use of a particular module in a receptacle.

In accordance with another aspect of the invention, there is provided a system for constructing a digital control system of the type formed from a plurality of separate, generally flat, modules insertable into a supporting structure in generally parallel relationship at spaced receptacles, which system comprises (a) means for supporting a first bus network of a number of process active, first electrical conductors extending in a first direction. generally orthogonal to the modules, with the first conductors being electrically interrupted at the individual receptacles, (b) means for supporting a second bus network of a number of second electrical conductors extending in the first direction and generally parallel with the first conductors, with the second conductors being electrically continuous through the individual receptacles and (c) a set of modules, at least one of which has first and second edge connectors, with the first edge connector having an array of terminals aligned with and interconnecting the first conductors and the second edge connector having terminals connectable to the second conductors. In this manner, a module can determine the interconnection between the two bus networks.

In accordance with another aspect of the invention, there is provided a module for a system as defined above and having a shape indicative of a predetermined connection scheme for the module, which scheme can include either a first edge connector extension connectable with the first bus network, a second edge connector extension connectable with the second bus network or both of such edge connectors. In this manner, the shape or profile of the module itself determines its function with respect to interconnecting the two separate and distinct, spaced bus networks.

Prior Patents

U.S. Pat. No. 3,815,099 relates to the use of a selected bus network wherein the conductors have preselected functions in a digital control system connectable to a microprocessor. U.S. Pat. No. 4,050,098 relates to a self-addressing scheme wherein a module or card inserted into a particular receptacle determines the address of the card, by use of a series of address lines in a system. This latter patent is incorporated by reference herein, in that the particular card employed in the present invention can also use this self-addressing scheme in the local bus network. In the prior patent on self-addressing the system, data of the bus network is connected in parallel with the motherboard as is common.

BRIEF DESCRIPTION OF THE DRAWINGS

FIG. 10 is an enlarged cross-sectional view showing a part of the terminal extension employed in a card or module construction in accordance with the present invention;

FIG. 11 is an enlarged cross-sectional view showing a part of an extension as shown in FIG. 10 with a different operating function;

FIG. 12 is a schematic overall line diagram illustrating parallel conductors arranged in a manner contemplated by the present invention and as employed in the frame or structure illustrated in FIG. 1;

FIG. 18 shows two connecting schemes employed at the local bus network for utilizing the present invention to provide isolation and barriers between adjacent local systems, as contemplated by the present invention;

PREFERRED EMBODIMENTS OF THE INVENTION

Figure 1:
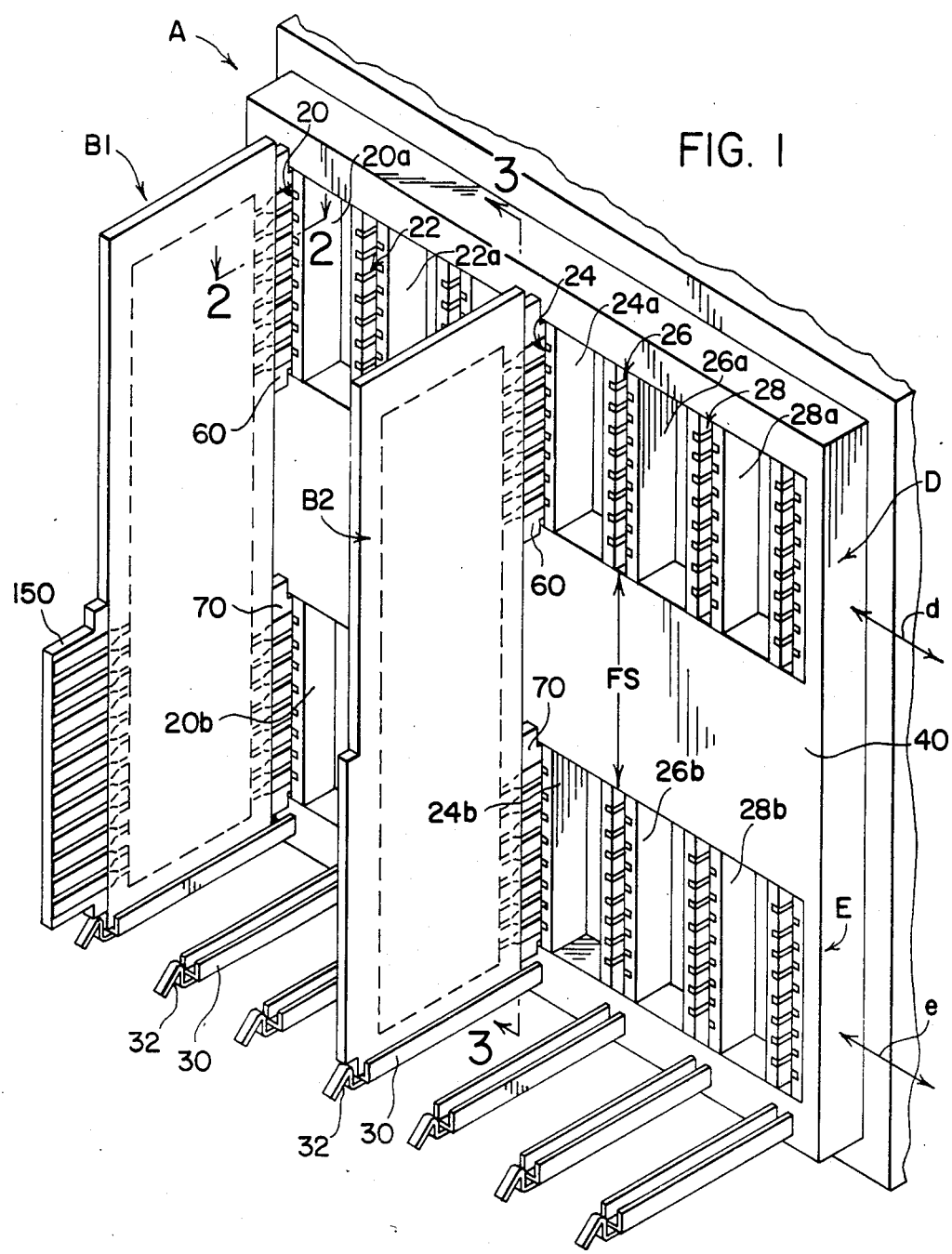
FIG. 1 is a partial pictorial view showing two boards, cards or modules B1, B2 in a frame or rack structure constructed in accordance with the present invention.
Figure 3:
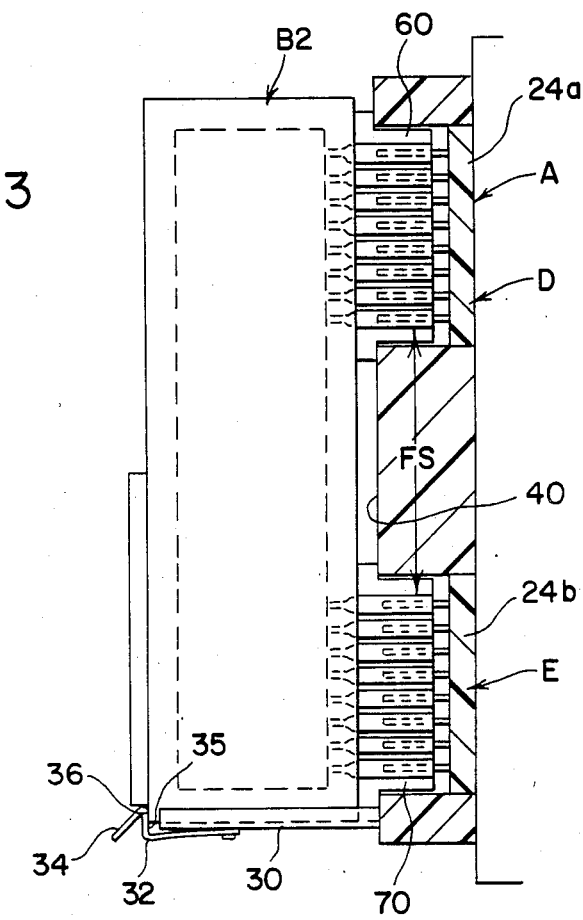
FIG. 3 is an enlarged, cross-section view taken generally along line 3—3 of FIG. 1.

Referring now to the drawings wherein the showings are for the purpose of illustrating preferred embodiments of the invention only, and not for the purpose of limiting the same, FIG. 1 shows a frame or rack A which may take a variety of forms and includes axially spaced receptacles adapted to receive and secure cards, boards or other modules B1, B2 ... BN. As many boards or cards as are necessary to construct a total digital control system can be mounted in frame A, as long as there are sufficient card or module receptacles such as those shown as receptacles 20-28 in FIG. 1. Any number of receptacles could be employed; however, it is contemplated that a standard unit having ten receptacles would be appropriate. Each of these receptacles include an upper portion 20a-28a and respective lower portions 20-28b. Some type of snap-in or mounting mechanism is provided for holding the boards in the receptacles. In FIGS. 1 and 3, these mechanisms include a lower support channel 30 having a detent spring 32 with a front cam portion 34 defining a rear shoulder 35 adapted to engage shoulder 36 of a card. A similar arrangement is provided at the upper portion of the card to hold the card in place. Each receptacle 20-28 can be provided with a further lower portion represented schematically as portions 22c-28c in FIG. 12. This portion has conductors for use in self-addressing, such as shown in U.S. Pat. No. 4,050,098. This prior patent relates to use of a single bus network that has a portion of address lines that can select a particular module. That scheme can be used in the lower bus network L. To illustrate this feature a part of the lower bus network is shown separated as the self-addressing portion SA.

In accordance with the present invention, two spaced parallel areas D, E extend in parallel directions represented generally as arrows d, e. If self-addressing is used, receptacles 20-28 include a portion F extending in the direction of arrow f shown in FIG. 12. This is combined with portion L to make a single bus network. Hereafter L will be used for the total bus network with or without self-addressing as shown in FIG. 12. A portion 40 of frame A is a separation portion between the upper area D and the lower parallel area E or E and F combined. Spacing between these two areas is fixed so that the upper bus network S is generally parallel from the lower bus network L (which may include portion F) and is in a fixed spaced relationship so that insertion of the cards, boards or modules can allow the board itself to selectively form a particular architecture for a given digital process control system incorporating various standard components mounted on or connected to the boards or cards. The fixed space relationship is indicated by "FS" and means that the use of this spacing between two terminal arrays or connector extensions on the board can allow for either connection of the board with network S, network L, or both networks S, L. The use of two parallel bus networks fixedly spaced with respect to each other and connectable by appropriately profiled boards received in receptacles fixed with respect to the bus networks is a basic structural feature of the invention; however, as will be explained later, lower bus network L is unique in itself. The unique feature of the lower bus network allows the use of two parallel bus networks in a manner which facilitates the construction of two separate, distinct local digital process control systems with or without interconnection of the local systems, or master control over these systems by logic in the upper bus network S. This unique feature of the lower bus network L in the motherboard of frame A will be described with respect to FIG. 12; however, other structural features of the preferred embodiment of the invention are provided for more detailed discussion of an installation using a preferred embodiment of the present invention.

Figure 2:
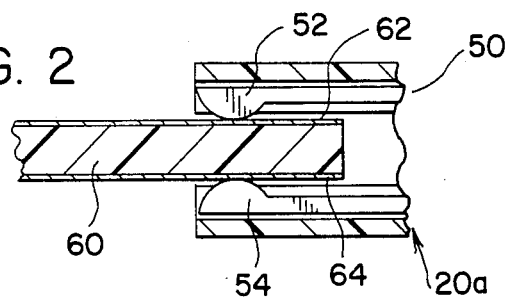
FIG. 2 is a partial, enlarged cross-section view taken generally along line 2—2 of FIG. 1.

Referring now to FIG. 2, the standard type of receptacle for an edge connection with a printed circuit board is schematically illustrated. In accordance with normal practice, such a receptacle includes a plurality of axially spaced spring elements 50 arranged on opposite sides of the receptacle and designated collective terminal array 50. Upper portion 20a of receptacle 20 is shown as for illustrative purposes. Array 50 has terminals 52 spaced along the other side. These individual terminals are spring biased toward extension 60 of one of the circuit boards. This extension has a terminal array formed in standard practice by a plurality of axially spaced terminals 62 on one side and axially spaced terminals 64 on the other side. Each of these card mounted terminals are arranged in proper sequence to engage one of the spring elements 52, 54, respectively. This type of edge connection between the edge of a printed circuit board and the motherboard located in frame A and having the structure shown in FIG. 12 is common practice.

In accordance with the present invention, another terminal extension 70 is located in a spaced position with respect to extension 60. On one of the boards, this extension is adapted to use terminals 62, 64 in the lower portion of the receptacle, such as combined portions 20-20c or 20b alone (when no self-address is employed). As so far described, the printed circuit boards include two spaced terminal extensions 60, 70 which are spaced from each other a distance determined by the fixed spacing FS between separate receptacle portions in frame A. In this manner, extension 60 can plug into and interconnect the many terminals forming bus network S and extension 70 can extend into and form electrical connections between the printed circuit board, card or module and the parallel electrical conductors forming bus network L. These networks will be described in detail with respect to FIG. 12 and their operation in accordance with the present invention will become apparent.

Referring now more particularly to FIG. 12, the upper bus network S is formed from a multitude of generally parallel electrical conductors, a few of which are shown as electrical conductors 100-110. Each of these conductors is connected to one of the terminals 52, 54 to produce a series of connections with the various conductors in the network at terminals Nos. 1, 3, 5, etc. at the left side of the upper receptacle portion. In the like manner, alternate electrical conductors are connected to terminals 54 which are designated terminal Nos. 2, 4, 6, etc. Thus, the terminal array on the upper extension 60 of a particular board is used to join components on the board with the various multitude of electrical conductors forming a somewhat standard bus network S. At a fixed distance in frame A below network S there is provided a second network L (or L and SA) also formed from a multitude of generally parallel electrical conductors 120-124. This lower bus network at the lower portion of frame A forms a portion of the present invention in that the multitude of conductors in network L, which may number several dozen, are interrupted between terminals 52, 54 at lower receptacle portions 20b, 22b, 24b, 26b, 28b, respectively. The conductors in the lower bus network can also include self addressing lines such as lines 130. Consequently, insertion of a board, card or other module having an extension 70 on one edge thereof will determine the continuity of the various electrical conductors in lower bus network L, as the extension extends across the individual lower receptacle portions as shown in FIG. 12. A somewhat standard self-addressing arrangement may be employed in the lowermost portion of FIG. 12; however, this does not form a part of the invention and is illustrated only for the purpose of indicating that the various cards, boards or modules may have the same lines in the lower bus network to provide self-addressing of the various modules as taught in U.S. Pat. No. 4,050,098. In this manner, the particular location in which a module is installed in frame A determines its physical address with respect to the conductors shown in the lower portion of FIG. 12. These lower conductors may number sixteen or so and are designated generally as bus sub-network SA. These conductors are illustrated as conductors 130 and may take any form which will allow selectivity of a particular printed circuit board or module with respect to a logic on one of these designated lines. These address lines are not process active in that they are used only for the purpose of addressing a module. Any data to be inputted to or outputted from an addressed module would be from the logic lines 120-124 of network L.

The internal structure or circuits on the printed circuit boards, modules or cards, are schematically illustrated in FIG. 12 wherein the terminals 52, 54 are aligned on opposite sides of the receptacle portions and can be connected to a series operated circuit on the board as shown by component 132. Component 134 is a parallel connected component which is jointly connected to space terminals 52, 54 at two locations to provide a parallel connection, as indicated. It is also possible to provide a straight through conduction between terminals on either side of the receptacle when a module or card is inserted. This concept is illustrated by a jumper 136 carried by the card. In this manner, bus network L passes through the particular receptacle and allows interconnection between adjacent receptacles by the mere insertion of a predeterminded type of module, card or board into the particular receptacle of frame A.

The architecture of a system is determined by the location and design of the various axially spaced, generally parallel boards supported in frame A. A particular board can be provided with extension 150 having a terminal array, such as provided on extensions 60, 70. The terminals 52, 54 of extensions 150 can be connected by appropriate edge connectors to external devices such as memories. Generally, this arrangement is used for I/O devices.

Referring now to FIG. 10, one of the lower extensions 70 has edge terminals 62, 64 to engage aligned receptacle terminals. A jumper pin 160 forms an electrical jumper, such as jumper 136 in FIG. 12. Consequently, FIG. 10 illustrates an arrangement for interconnecting the various electrical conductors forming lower bus network L. In practice, the bus network L is usually interconnected as a unit totally, except for the self-address lines in network L. Thus, extension 70 on a particular board which is used to pass the electrical conductors of bus network L through or across a given receptacle would provide a jumper 160 for all the process active lines. Thus, insertion of this particular edge extension into the receptacle located at parallel area E would interconnect the left hand conductors with the right hand conductors. This would convey the bus network L from one side of the receptacle to the other side of the receptacle. To terminate the bus network L, the jumpers would be eliminated. This could be done by leaving extension 70 off the module or by providing edge extension 70 with terminals on only one side thereof, without an interconnection through the particular card.

In summary, the individual electrical conductors forming the lower bus network L are not continuous through the receptacles. They may be made continuous through the receptacle only by insertion of some item into the receptacle. In practice, this item is an extension on a particular card. The inserted card may include operative components to be used with the logic on conductors in network L or the card may isolate the electrical conductors on opposite sides of the receptacle. A further arrangement is one where one side of the receptacle is active and the opposite side has no active electrical terminals. In other words, it is possible to make the right hand side or the left hand side of the receptacle active, in that logic is directed to or from the left hand or right hand conductors without interconnecting the conductors through the receptacle.

Referring now to FIG. 11, an isolating arrangement is illustrated to show the form of extension 70 used to terminate the digital processing system connected to frame A. In this instance, terminals 62 on extension 70 are used to process and control logic circuits 170 on the module B. Terminals 64 engage the other terminals in the receptacle and are isolated from terminals 62. Thus, an interruption of bus network L occurs. In this manner, a second control system could be used at the next receptacle in frame A to form an architecture using the same conductors of network L. By interrupting the conductors of network L, as shown in FIG. 12, frame A can be used to provide separate and distinct, independent digital systems without cross-talk or interconnection.

By providing the novel arrangement of a bus network wherein conductors are not connected between opposite sides of the various receptacles, it is possible to construct two or more separate and distinct digital control systems on frame A using the same conductors without time sharing. For instance, boards or cards could be placed into the receptacles in a manner schematically illustrated in FIG. 12. In socket A, a processor board could be inserted. This board would have the digital processor. In socket B a module could be employed for reading the logic on the various conductors in network L and processing this logic in accordance with standard digital practice. In the next socket C, a series of jumpers could be employed for interconnecting the left hand group of electrical conductors with the right hand group of electrical conductors. In socket D the card terminates the system. In this instance, components or logic circuits 138 are interconnected by the terminal array at the left hand side of the extension 70 of a card or board. As can be seen, the total digital system terminates at socket D. To the right of socket D, a separate and distinct digital processing system could be constructed using conductors of network L. If this separate control system was to be interconnected with the first system by a master controller by cross talking, it is possible to then use the upper extensions 60 of a board or card in each system. Terminals 52, 54 would connect the cards with the electrical conductors of upper bus network S. By employing a combination of boards having different configurations with respect to extensions 60, 70 various arrangements can be employed for controlling the architecture of a digital control system mounted in a single standard frame A. This versatility will be explained later with respect to different types of systems which can interconnect the fixedly spaced bus networks S, L on standard frame A.

Figure 4:
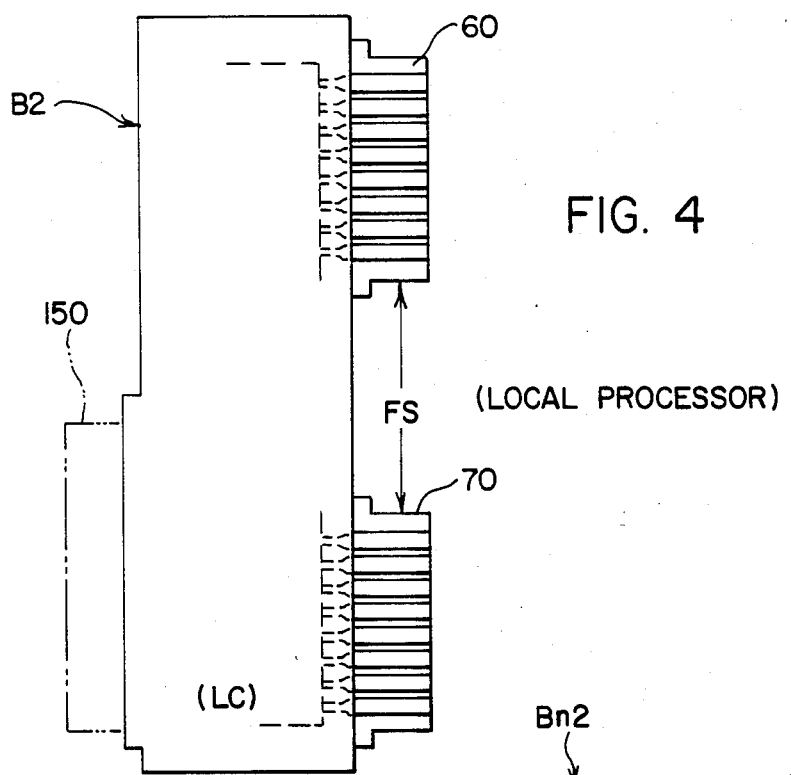
FIGS. 4-8 are side elevational views showing standard modules employed in accordance with the present invention having different functions in the digital control system determined by the selected shape or profile of the card or module.
Figure 5:
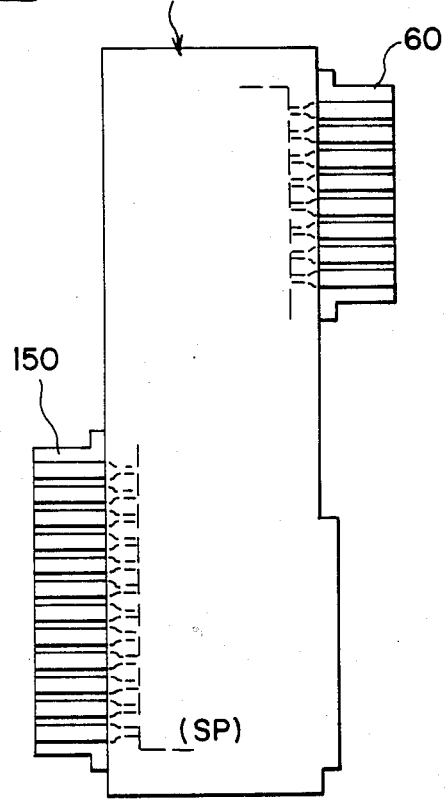

To practice one aspect of the present invention, a bus network is interrupted at the receptacles and is used in combination with a continuous bus network. By spacing these networks in a preselected standard configuration, the profile or shape of each card or module can determine the general overall function. For instance, referring now to FIG. 3, card B2 includes an upper extension 60 and lower extension 70 spaced apart a standard fixed amount FS so that card B2 can be inserted into a receptacle with the terminal array on extension 60 forming the connection with bus network S and a terminal array on lower extension 70 forming the electrical connection with the bus network L. Extensions 60, 70 are on one edge of board B2. Lower extension 70 controls the electrical continuity through board B2 from one side of the receptacle to the other side. The terminal arrays could be interconnected as shown in FIG. 10 to provide continuity between the parallel conductors of bus network L or they could be provided with appropriate connections with components on the module such as schematically illustrated components 132, 134 and 138 in FIG. 12. In FIG. 4, the standard board includes two spaced terminal extensions 60, 70 which allows a direct interconnection between the upper and lower bus networks S, L. This could be used as a local processor, wherein card B would be the central processing unit and certain perpheral circuits therefor. Standard data is directed through the terminal array on extension 60 to upper bus network S. This would allow for communication of the local processor with the upper bus network, while the lower network L is employed by use of extension 70. This would allow communication from card B2 to another adjacent card in a particular local processing system. Another card Bn2 is shown in FIG. 5, wherein only upper extension 60 is employed. This card or module also includes an extension 150 at the opposite edge of the module which is a standard connector used to interconnect module Bn2 with the outside world in the form of an I/O device, a system memory or peripheral equipment. A card having the form shown in FIG. 5 would be of the type which would interconnect the upper bus system S with the card and also interconnect the outside world with the card and with network S. There is no extension 70; therefore, this card could not form an interconnection between adjacent electrical conductors of network L. The card profile shown in FIG. 5 would have a particular operational function allowing interconnection of the upper bus system with the outside world only. Such an arrangement is applicable for use with a system memory wherein the memory is interconnected with extension 150 by a standard edge connector.

Figure 6:
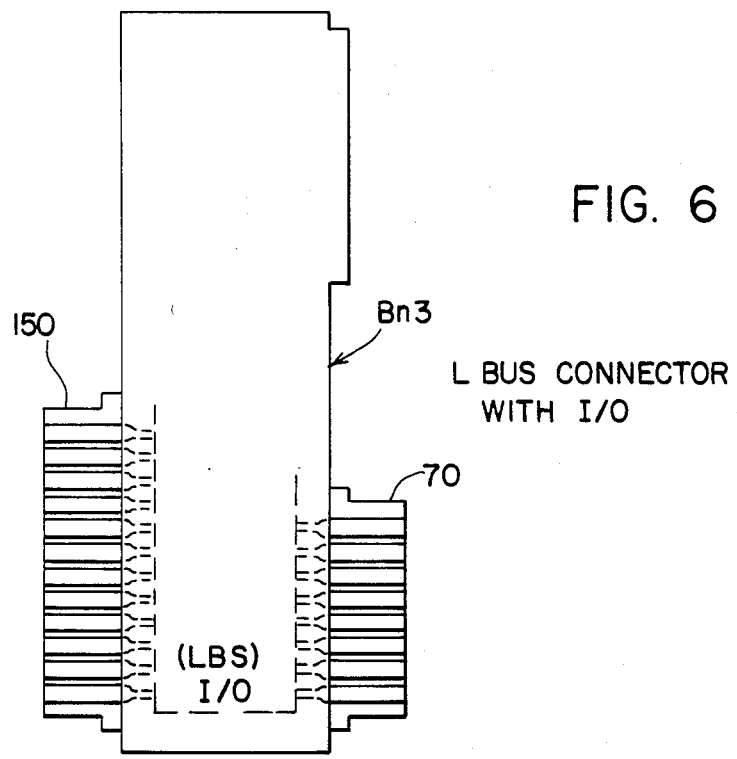
Figure 7:
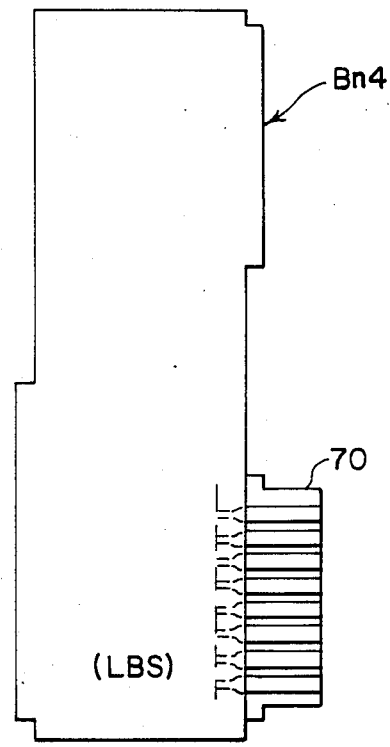

Another profile for a module using the present invention is illustrated in FIG. 6 wherein an outside world edge connector or extension 150 is employed with an extension 70. This would allow for the interconnection of external I/O terminals with module Bn3 for connection with various electrical conductors forming lower bus network L. When it is desired to communicate electrical conductors of network L through a particular receptacle or module nest, a particular profile shape such as shown in FIG. 7 can be employed. This shape or profile includes only extension 70 which would allow electrical connection through the receptacle by employing the structure shown in FIG. 10. Thus, the profile or shape of module or card Bn4 is indicative of its intended use. This same concept is true with respect to the three distinct shapes of the cards or modules shown in FIGS. 4–6.

Figure 8:
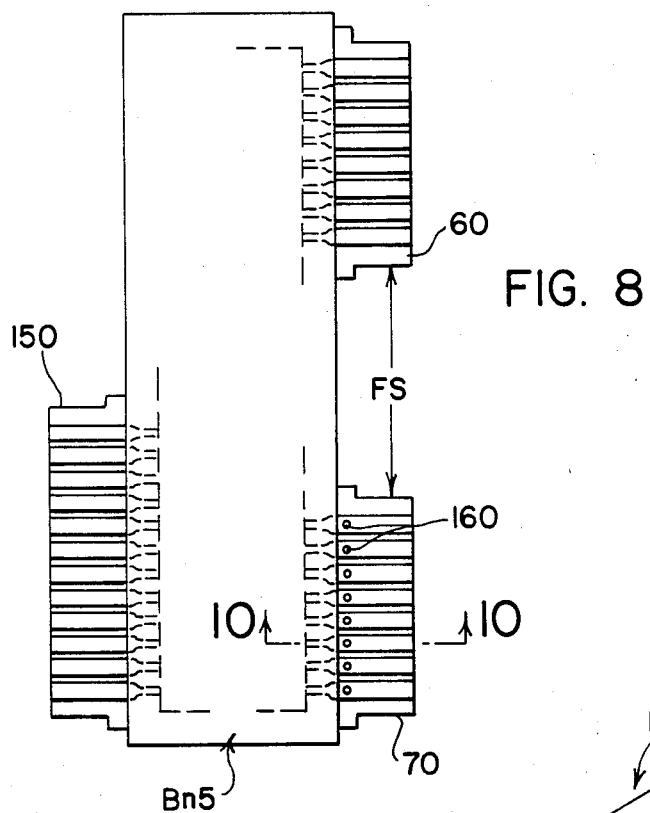
Figure 9:
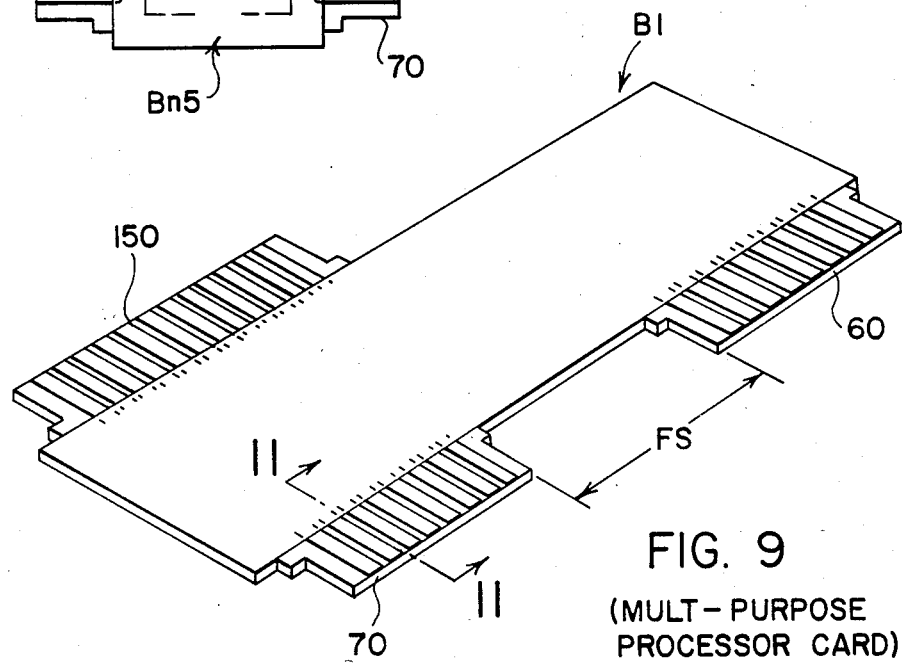
FIG. 9 is a pictorial view of one of the cards or modules constructed in accordance with the present invention and illustrated as a multi-purpose processor card in FIG. 1.

The next profile is illustrated in FIGS. 8 and 9 wherein all extensions 60, 70 and 150 are used for module Bn5 or B1. In this instance, all electrical connections are employed. By using jumpers 160 as shown in FIG. 10, on the terminal arrays of extension 70, module Bn5 interconnects positionally aligned conductors forming network L. In all instances, the spacing between the connector extensions 60, 70 is fixed from one module to the other so that cards may be interchanged. This feature, in combination with the novel concept of providing interrupted electrical conductors at the receptacles, allows versatility and selectability in the system architecture.

Figure 13:
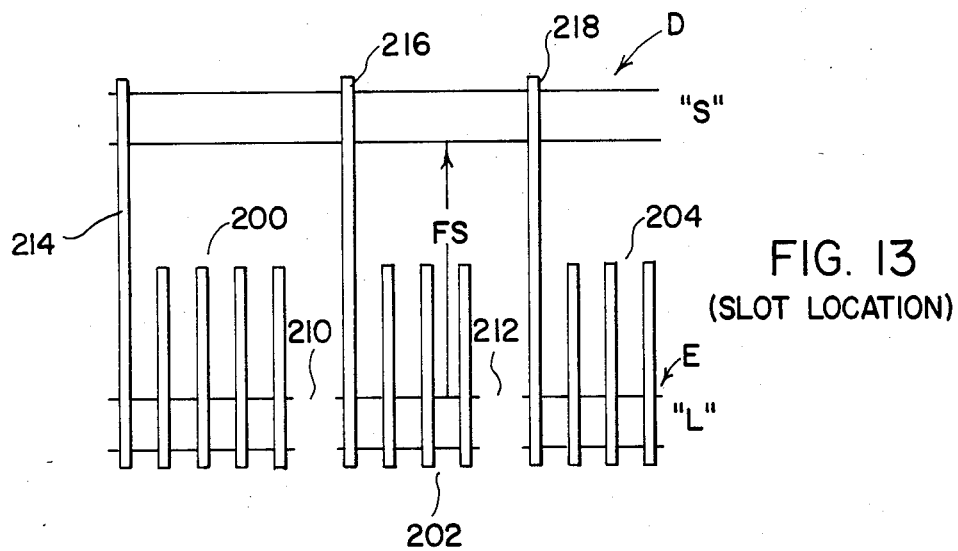
FIG. 13 is a schematic layout view showing several independent digital control systems isolated from each other and communicated with a standard system bus network.
Figure 14:
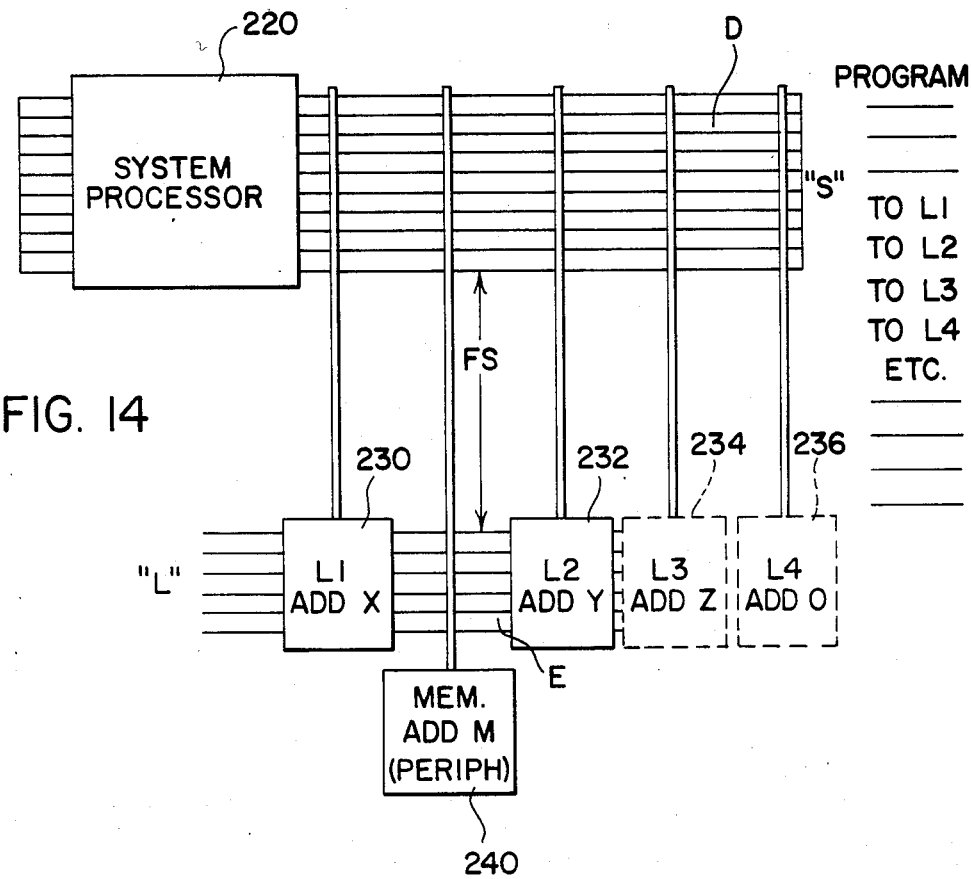
FIG. 14 is a layout showing spaced bus networks as contemplated by the present invention and including an illustration of a schematic system processor together with a memory unit or add-on peripheral unit as contemplated by using the present invention.

An illustrated use of the present invention is found in FIG. 13. Separate and distinct control systems 200, 202, 204 are connected to the lower bus network L. Interruptions occur at receptacles 210 and 212. Each of the systems 200, 202 and 204 include at least one module which interconnects both lower network L and upper network S. These modules, illustrated as modules 214, 216, and 218, allow control of the separate and distinct systems by logic on upper bus network S. System control of logic on designated conductors of network S is by use of a somewhat standard microprocessor or central processing unit 220, as shown in FIG. 14. In this manner, each of the many individual electrical conductors forming the somewhat standard bus network S would have predesignated use. Processor card 220 controls each of the separate systems 200, 202 and 204 shown in FIG. 13. FIG. 14 shows individual local control systems as having addresses X. Y, Z and O. These local systems 230, 232, 234 and 236, respectively, are controlled by the logic on the electrical conductors forming upper network S. By using a board, such as shown in FIG. 5, a separate system memory or peripheral unit 240 is used in conjunction with processor 220 for controlling the logic on lines of network S. The various controllors 230–236 are used much like sub-routine devices to be called up by system processor card 220. In this manner, an appropriate Executive Program, as shown on the right of FIG. 14, could be employed wherein processor 220 shifts to one of the separate and distinct control systems at addresses X, Y, Z, or O to process particular sub-routines by the separate and distinct systems sharing use of the conductors in lower bus network L. When employing the architecture of FIG. 13, the modules 214, 216 and 218 have the profile shape, as shown in FIGS. 3 and 4. The other modules in the individual systems 200, 202 and 204 would include profiles as shown in FIGS. 6 and 7. When external equipment is to be used, the profile of FIG. 6 would be employed in the systems 200, 202 and 204.

Figure 15:
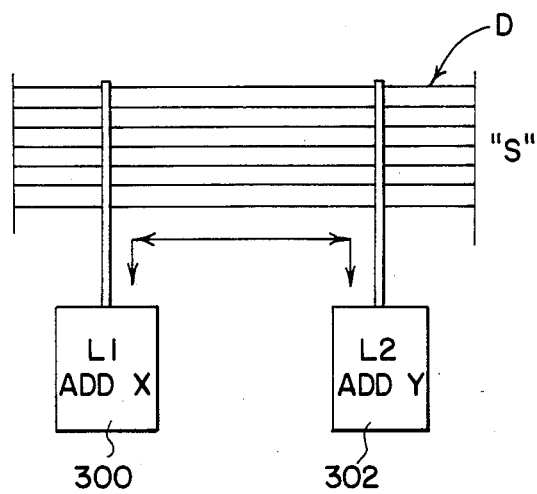
FIG. 15 is a schematic general line diagram illustrating the use of the present invention wherein the system bus network is released and is used for crosstalk between isolated, individual control systems connected in accordance with the present invention.

Referring now to FIG. 15, two local controllers 300, 302 are constructed to share the electrical connectors forming lower bus network L. Each of these systems have at least one connection with the upper bus network S by using a module, card or board having a profile such as shown in FIG. 4. In this particular example, bus network S is not controlled by a master controller such as that shown in FIG. 14. Thus, the upper bus network S floats and is used for cross talk between adjacent systems 300, 302.

Figure 16:
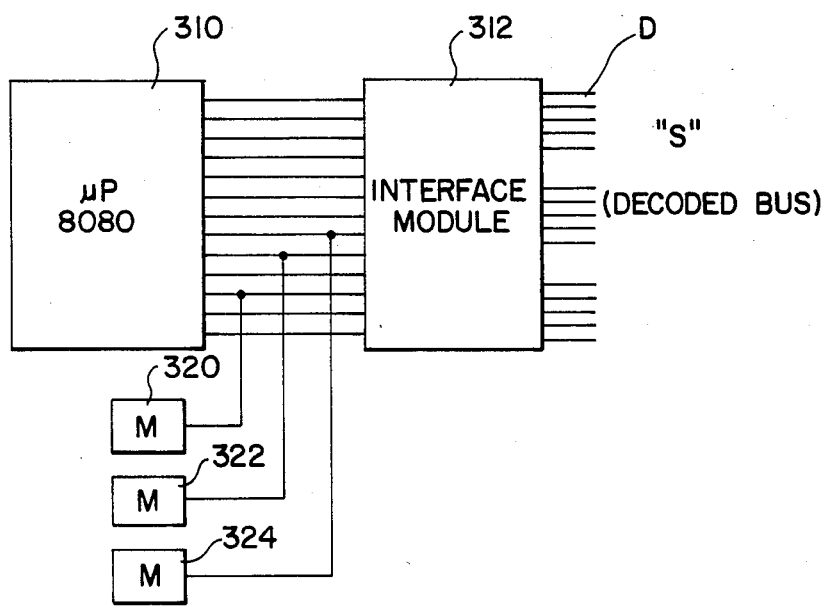
FIG. 16 illustrates a schematic block diagram for applying designated functions to various conductors in the system bus network contemplated in accordance with an aspect of the present invention.

In FIG. 16 a standard arrangement is illustrated for providing the logic designations for the individual electrical conductors extending through the various receptacles and forming the parallel conductors of upper bus network S. The microprocessor, such as the Intel No. 8080 is used as a central processing unit 310. A series of memory units 320, 322 and 324 are employed to control information to an interface module 312. The logic on conductors of bus network S is created at the output side of interface module 312.

Figure 17:
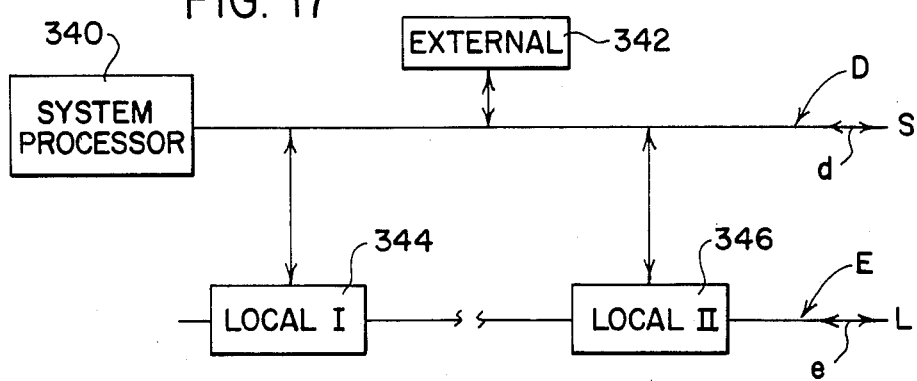
FIG. 17 is a schematic block and line diagram illustrating another connection scheme between two spaced bus networks as contemplated by the present invention.
Figure 17A:
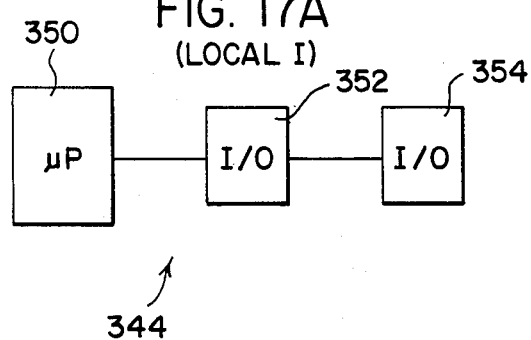
FIGS. 17A, 17B are schematic representations of the type of local systems which are contemplated for use with a total system scheme, as schematically illustrated in FIG. 17.
Figure 17B:
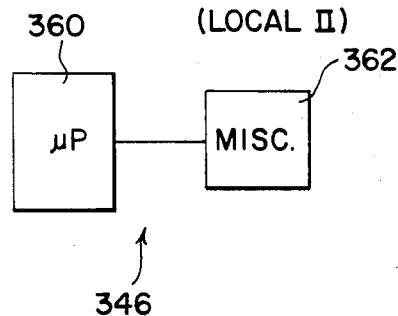

FIGS. 17, 17A and 17B illustrate another example of how to use the present invention to create control systems. In this instance, a system processor 340 is connected to upper bus network S and communicates directly with external circuitry 342. Separate and distinct local controllers 344, 346 are also connected to network S as shown in FIGS. 13 and 14. These local controllers 344, 346 are isolated from each other. In the illustrated embodiment, controller 344 includes microprocessor 350 together with I/O terminals 352, 354. In this manner, local controller 344 is a mini-computer and can be synchronized or otherwise coordinated by system processor 340. Local controller 346 is a microprocessor 360 with a miscellaneous accessory device 362. By interconnecting the separated local processing systems 344, 346 with bus network S, all systems 340, 344 and 346 can be mounted in a single frame A. In doing this, the board shown in FIG. 5 is employed for system 340. Extension 150 is employed for connecting external circuits, such as memories indicated as 342 in FIG. 17. A module, such as shown in FIG. 4, is used to interconnect system 344 with bus network S. The same arrangement is employed for controller 346. I/O units 352, 354 employ boards such as shown in FIG. 6. A board, such as shown in FIG. 7, is used by miscellaneous circuit 362 for interconnecting components on the board with bus network L. As can be seen, the use of a bus network, which can be interconnected at the receptacles by selection of a particular module, provides substantial versatility in a standard construction. Lower network L, in combination with a fixed positioned upper bus network S, allows interconnecting of the various isolated independent local controllers with a system or master controller. To expand the capacity of frame A it is only necessary to add more boards or modules. If a portion of frame A is to be used in a separate control system, it can be used by providing isolation, either by a special module or card or by the absence of a card or an absence of an extension 70 on a card. This general concept is illustrated schematically in FIG. 18. Separate controller 380 is a separate card or board having a left set of terminals isolated by separation at position 380a. The second board 382 is an I/O board controlled by processor 380. A motherboard 384 connects the control module 380 with the I/O module 382. To provide a second system, controller 390 can be on a card inserted into the next module receptacle. By providing an isolation of the pins or terminals on the left side of extension 70 for the board supporting controller 390, controller 390 is isolated from controller 380. As can be seen, systems using bus network L can be isolated providing electrical discontinuity of the terminals on either edge of extension 70. The same concept is employed in the lower portion of FIG. 18 for controller 400 used with output modules 402, 404. At the right end of this system, there is an opening 410 which isolates the system from any subsequent system connected to bus network L.

Figure 19:
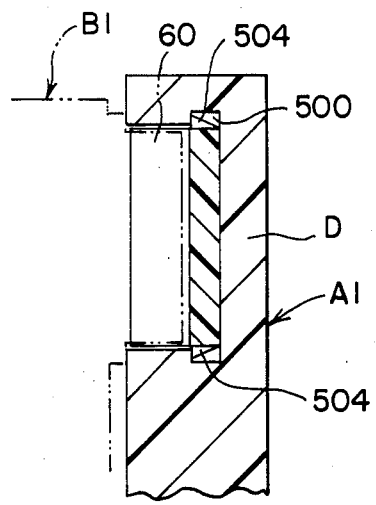
FIG. 19 is an enlarged, partially cross-sectional view illustrating a modification of the invention.
Figure 20:
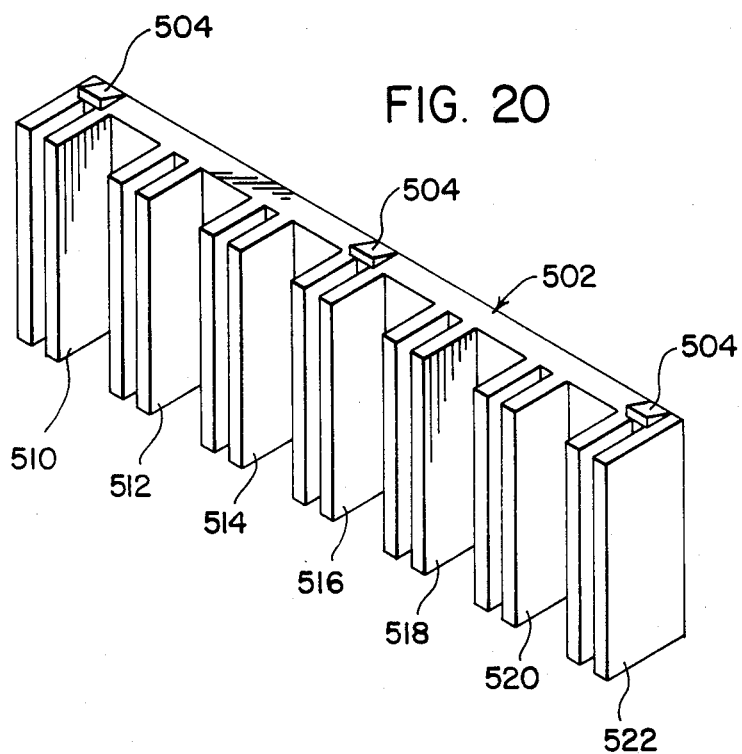
FIG. 20 is a pictorial view showing a modification of the present invention as illustrated in FIG. 19.

In some instances, the upper continuous conductor bus network S may not be employed in frame or rack A. In that instance, a modified frame A1, as schematically illustrated in FIG. 19, could be used. This frame has a motherboard recess 500 extending along area D. Recess 500 supports a motherboard unit 502 which is snapped in place and held thereby a series of detents 504. Motherboard unit 502 has spaced module receptacles 510-522 for receiving board edge extensions 60 as previously described. By supplying frames with an upper receptacle to accept unit 502, the initial investment by a customer need only involve the novel bus network L. Thereafter, updating of the system can be done by utilizing the selectably inserted, elongated motherboard unit 502 assembled into previously provided recess 500.

Having thus described our invention, it is claimed:

1. A structure for supporting generally flat modules of the type containing electrical circuits for digital processing of data and having an elongated bus network connecting edge extending in a predetermined path, said structure including: a number of separate module receiving means each for receiving and retaining one of said modules with said path of said module edge intersecting first and second spaced, generally parallel areas of said module supporting structure; said first and second generally parallel areas extending in a preselected direction; a first bus network at said first area of said module supporting structure and containing several process active, individual first electrical conductors extending generally parallel to said preselected direction whereby said first electrical conductors are electrically connectable to the portion of said module edge which intersects said first area of said structure; means on said structure for interrupting said first electrical conductors at said module receiving means; means for allowing selected ones of said first conductors at a given module receiving means, as a controlled group, to be electrically interconnected by insertion of a special module having a preselected interconnection feature according to said selected ones of said first conductors into said given receiving means; and, including means for mounting a second bus network at said second area of said module supporting structure and containing several individual second electrical conductors extending generally parallel to said preselected direction and continuous through each of said receiving means at said second area whereby said second electrical conductors are electrically connectable to the portion of said module edge which intersects said second area of said structure.

2. A system for constructing a digital control system of the type formed from a plurality of separate, generally flat, modules insertable into a supportable structure in generally parallel relationship at spaced receptacles, said system comprising:

(a) means for supporting a first bus network of a number of process active, first electrical conductors extending in a first direction generally orthogonal to said modules, said first conductors being electrically interrupted at said receptacles with each of said first conductors connected to aligned terminals on opposite sides of said receptacles;

(b) means for supporting a second bus network of a number of second electrical conductors extending in said first direction and generally parallel with said first conductors, said second conductors being electrically continuous through said receptacles with each of said second conductors connected to a selected terminal on one side of said receptacle;

(c) a set of said modules at least one of which has first and second edge connectors, with said first edge connector having terminals aligned with and interconnecting said aligned terminals of said first conductors and said second edge connector having terminals connectable to a selected terminal of one of said second conductors; and, (d) each module having a shape indicative of a predetermined connection scheme for said module, with either a first edge connector extension connectable with said first bus network, a second edge connector extension connectable with said second bus network or both of said edge connector extensions, where said first edge connector extension interconnects selected ones of said first electrical connectors.

3. A module as defined in claim 2, said module having a third edge connector extension for connection of said module with electrical I/O conductors independent of said supporting means.

* * * * *